United States Patent
Kim

(10) Patent No.: US 7,646,226 B2
(45) Date of Patent: Jan. 12, 2010

(54) ADAPTIVE BANDWIDTH PHASE LOCKED LOOPS WITH CURRENT BOOSTING CIRCUITS

(75) Inventor: Byung-chul Kim, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 115 days.

(21) Appl. No.: 11/826,901

(22) Filed: Jul. 19, 2007

(65) Prior Publication Data
US 2008/0048741 A1 Feb. 28, 2008

(30) Foreign Application Priority Data
Aug. 22, 2006 (KR) ............. 10-2006-0079466

(51) Int. Cl.
*H03L 7/06* (2006.01)
(52) U.S. Cl. .................................... 327/157
(58) Field of Classification Search ........ 327/147, 327/148, 156, 157
See application file for complete search history.

(56) References Cited

U.S. PATENT DOCUMENTS

| 5,144,156 | A | * | 9/1992 | Kawasaki | 327/157 |
|---|---|---|---|---|---|
| 5,703,511 | A | * | 12/1997 | Okamoto | 327/157 |
| 5,933,037 | A | * | 8/1999 | Momtaz | 327/157 |
| 6,812,754 | B1 | * | 11/2004 | Nakanishi | 327/157 |
| 7,148,757 | B2 | * | 12/2006 | Chiu | 331/16 |
| 7,176,733 | B2 | * | 2/2007 | Haerle | 327/157 |
| 7,327,195 | B2 | * | 2/2008 | Sawada | 331/16 |

FOREIGN PATENT DOCUMENTS

| JP | 2005-252930 | 9/2005 |
|---|---|---|
| JP | 2005-260445 | 9/2005 |
| KR | 1020040040047 A | 5/2004 |

* cited by examiner

*Primary Examiner*—Jeffrey S Zweizig
(74) *Attorney, Agent, or Firm*—Harness, Dickey & Pierce, P.L.C.

(57) ABSTRACT

An adaptive bandwidth phase locked loop (PLL) includes a phase frequency detector configured to generate a comparison pulse having a pulse-width and sign corresponding to a difference between a reference frequency and a first frequency. A pulse-voltage converter is configured to generate a control voltage corresponding to the comparison pulse. An oscillator is configured to generate the output frequency corresponding to the control voltage.

23 Claims, 5 Drawing Sheets

ADAPTIVE BANDWIDTH PHASE LOCKED LOOPS WITH CURRENT BOOSTING CIRCUITS

PRIORITY STATEMENT

This non-provisional patent application claims priority under 35 U.S.C. § 119 to Korean Patent Application No. 10-2006-0079466, filed on Aug. 22, 2006, in the Korean Intellectual Property Office (KIPO), the entire contents of which is incorporated herein by reference.

BACKGROUND

Description of the Conventional Art

In conventional digital systems, a phase locked loop (PLL) may be used to generate a relatively high frequency operation clock using a relatively low frequency input clock signal. Conventionally, to reduce jitter and increase clock recovery time for external noise in a PLL, loop bandwidth may be increased. However, as loop bandwidth increases, input clock and/or operation clock stability may deteriorate.

FIG. 1 is a graph illustrating characteristics of a conventional adaptive bandwidth PLL. Referring to FIG. 1, a fixed bandwidth PLL may be designed with a relatively low (e.g., the lowest) operating frequency taking into account stability. Doing so, however, may deteriorate system performance of the fixed bandwidth PLL at relatively high frequencies. Alternatively, a conventional adaptive bandwidth PLL may have a loop bandwidth adaptive to operating frequency. In this example, a conventional adaptive bandwidth PLL may maintain more uniform performance regardless of changes in operating frequency. In one example, a conventional adaptive bandwidth PLL may maintain satisfactory performance independent of the operating frequency (output frequency) because a ratio of the loop bandwidth to input frequency (reference frequency) and a clamping factor have fixed values.

Accordingly, a conventional adaptive bandwidth PLL may maintain relatively high performance even at relatively high frequencies. In actuality, however, a conventional adaptive bandwidth PLL may not have a fixed ratio of loop bandwidth to input frequency and a fixed clamping factor.

FIG. 2A is a graph of loop bandwidth to input frequency ratio versus control voltage for a conventional adaptive bandwidth PLL. FIG. 2B is a graph of damping factor versus control voltage for a conventional adaptive bandwidth PLL.

Referring to FIGS. 2A and 2B, the ratio of the loop bandwidth to input frequency and the damping factor value of a conventional adaptive bandwidth PLL may change according to the control voltage. In this example, the control voltage may be proportional to the operating frequency (output frequency).

An operating frequency of a conventional adaptive bandwidth PLL may be calculated using Equation (1) shown below.

$$\omega_{VCO} = 1/(2\pi m C_{LOAD} R_{SYS}) = I_{CP}/2\pi n C_{LOAD} V_{SWING} \propto I_{CP} \quad (1)$$

In Equation (1), $\omega_{vco}$ is the operating frequency, $I_{cp}$ is a charge pump current, $C_{LOAD}$ is the capacitance of a loop filter and $R_{SYS}$ is the resistance of the loop filter. Also, $V_{SWING}$ is a swing width of the control voltage.

The input frequency may be N times higher than the operating frequency of the conventional adaptive bandwidth PLL, and thus, may be represented as Equation (2).

$$\omega_{REF} = \omega_{VCO}/N \propto I_{CP}/N \quad (2)$$

In Equation (2), $\omega_{REF}$ is the input frequency and N is a constant.

From Equations (1) and (2), the loop bandwidth of the conventional adaptive bandwidth PLL may be obtained using Equation 3.

$$\omega_n = \sqrt{\frac{I_{CP} s K_{VCO}}{2\pi N C_{CP}}} \quad (3)$$

In Equation 3, $\sqrt{(K_{VCO}/2*\pi*N*C_{CP})}$ is a given constant, and the loop bandwidth $\omega_n$ is proportional to the root of the charge pump current $I_{cp}$. The input frequency $\omega_{REF}$ and the loop bandwidth $\omega_n$ are respectively proportional to the charge pump current $I_{cp}$ or the root of the charge pump current $I_{cp}$.

Equation (4) may be used to obtain the damping factor of the conventional adaptive bandwidth PLL.

$$\zeta = \frac{R}{2}\sqrt{\frac{I_{CP}^s K_{VCO} N C_{CP}}{2\pi N}} \quad (4)$$

In Equation (4), R is the reciprocal of the conductance of the loop filter, and $(1/2)*\sqrt{(K_{VCO}/2*\pi*N*C_{CP})}$ is a constant. Thus, the damping factor is also proportional to the root of the charge pump current $I_{cp}$, as is the loop bandwidth $\omega_n$.

The charge pump current of the conventional adaptive bandwidth PLL may be obtained using two conductances, as shown in Equation (5).

$$1/I_{CP} \propto K*(g_{m,sym}*R_{sym}^{-1}) \quad (5)$$

In Equation (5), $g_{m,sym}$ is the conductance of the loop filter and $1/R_{sym}$ is the conductance of a voltage controlled oscillator (VCO).

FIG. 3 is a graph illustrating a rate of conductance change corresponding to the operating frequency of a conventional adaptive bandwidth PLL. Referring to FIG. 3, the conductances of the conventional adaptive bandwidth PLL vary based on the control voltage. As shown in FIG. 3, as the control voltage decreases, the rate of conductance change increases.

For example, in the conventional adaptive bandwidth PLL, the conductance and the charge pump current may change as the operating frequency changes, which may result in varying of the ratio of the loop bandwidth to the input frequency and the damping factor value.

SUMMARY

Example embodiments relate to phase locked loops (PLL), for example, to adaptive bandwidth PLLs having a more uniform loop bandwidth and/or damping factor over a range of operating frequencies.

Example embodiments may provide a more stable adaptive bandwidth phase locked loop (PLL) having a more uniform ratio of a loop bandwidth to input frequency and/or a more uniform damping factor value independent of frequency.

According to at least one example embodiment, a phase locked loop (PLL) may include a phase frequency detector, a pulse-voltage converter and an oscillator. The phase frequency detector may be configured to generate a comparison pulse having a pulse-width and sign corresponding to a difference between a reference frequency and a first frequency. The first frequency may be generated dividing an output frequency by a number. The pulse-voltage converter may be configured to generate a control voltage based on the comparison pulse. The oscillator may be configured to generate the output frequency based on the control voltage.

At least one other example embodiment provides a charge pump. A charge pump may include a current boosting circuit and a charge pump circuit. The current boosting circuit may be configured to generate a charge pump current, which may be proportional to a control current corresponding to the control voltage. The charge pump circuit may be configured to source or sink the charge pump current based on a comparison pulse, which represents a difference between a reference frequency and a first frequency. The first frequency may be generated by dividing an output frequency by number.

At least one other example embodiment provides a current boosting circuit. A current boosting circuit may include a current mirror, a resistor and an amplifying transistor. The current mirror may be configured to generate a first current corresponding to a first voltage. The resistor may have a first voltage drop and the amplifying transistor may be configured to generate a second current based on the first voltage drop across the resistor.

According to at least some example embodiments, the pulse-voltage converter may be further configured to generate the control voltage by charging or discharging charge using a charge pump current. The charge pump current may be proportional to (e.g., a square of) a control current corresponding to the control voltage. The pulse-voltage converter may include a charge pump and a loop filter. The charge pump may be configured to generate the charge pump current. The loop filter may be configured to change the control voltage by charging or discharging the charge by the charge pump current.

According to at least some example embodiments, the charge pump may include a current boosting circuit and a charge pump current circuit. The current boosting circuit may be configured to generate the control current as the charge pump current. The charge pump current circuit may be configured to source or sink the charge pump current based on a comparison pulse.

According to at least some example embodiments, the current boosting circuit may include a current mirror, a resistor and/or an amplifying transistor. The current mirror may be configured to generate the control current corresponding to the control voltage. The resistor may have a first voltage drop according to the control current. The amplifying transistor may be configured to generate the charge pump current using the voltage drop across the resistor. The amplifying transistor may be an NMOS transistor.

According to at least some example embodiments, the current mirror may include a plurality of transistors configured such that the current mirror generates the control current corresponding to the control voltage. For example, the current mirror may include a first transistor, a second transistor, a third transistor and a fourth transistor. The first transistor may have the control voltage as a gate voltage, and one terminal connected to a ground voltage. The second transistor may have a gate and one terminal connected to the first transistor. The third transistor may have a gate connected to the second transistor and one terminal connected to the resistor. The fourth transistor may have a gate and one terminal connected to the resistor and another terminal connected to the ground voltage. The plurality of transistors may include NMOS and PMOS transistors. For example, the first and fourth transistors may be NMOS transistors and the second and third transistors may be PMOS transistors.

According to at least some example embodiments, the charge pump current circuit may source the charge pump current when the comparison pulse has a first value and sink the charge pump current when the comparison pulse has a second value. The first and second values may be different. The loop filter may be a low pass filter in which capacitors may be connected in parallel.

According to at least some example embodiments, the phase locked loop may further include a reference frequency generator and/or a frequency divider. The reference frequency generator may be configured to generate the reference frequency. The frequency divider may be configured to divide the output frequency by n, where n is a natural number. The phase locked loop may be adaptive bandwidth phase locked loop.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS

Figure 1:
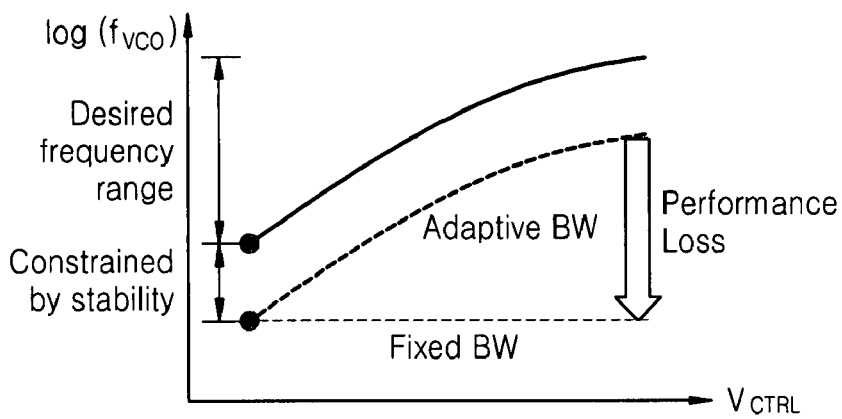
FIG. 1 is a graph illustrating characteristics of a conventional adaptive bandwidth phase locked loop (PLL)
Figure 2A:
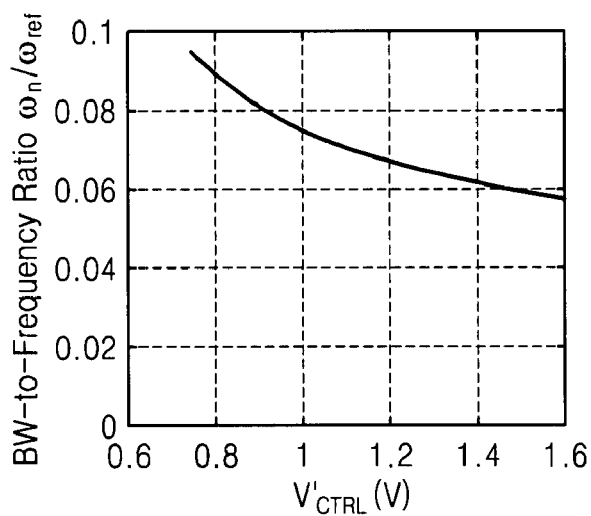
FIG. 2A is a graph of ratio of a loop bandwidth to input frequency versus control voltage for a conventional adaptive bandwidth PLL.
Figure 2B:
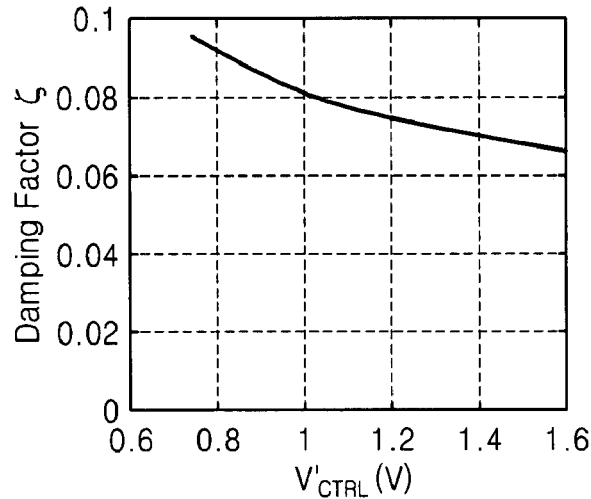
FIG. 2B is a graph of damping factor versus control voltage for a conventional adaptive bandwidth PLL.
Figure 3:
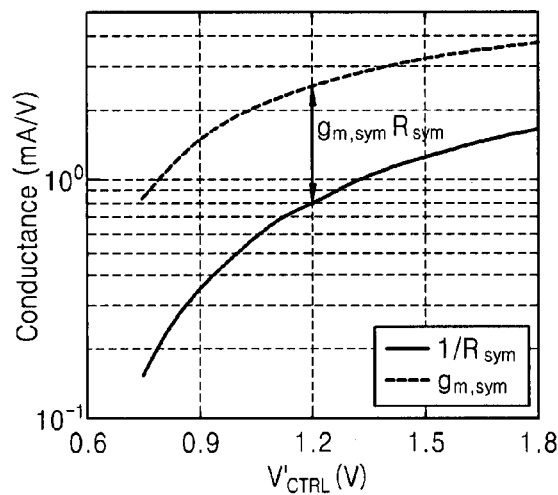
FIG. 3 is a graph illustrating a rate of conductance change corresponding to operating frequency of a conventional adaptive bandwidth PLL.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 4:
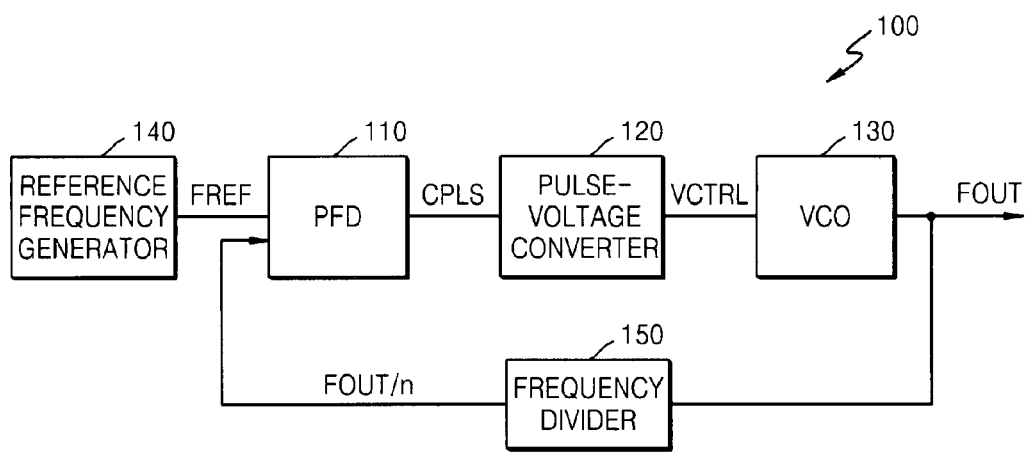
FIG. 4 is a block diagram briefly illustrating a PLL according to an example embodiment.

FIG. 4 is a block diagram illustrating a phase locked loop (PLL) according to an example embodiment. Referring to FIG. 4, a PLL 100 may include a phase frequency detector (PFD) 110, a pulse-voltage converter 120 and/or a voltage controlled oscillator (VCO) 130. The PLL 100 may be an adaptive bandwidth PLL.

The phase frequency detector 110 may generate a comparison pulse CPLS based on a reference frequency FREF and an output frequency FOUT. The phase frequency detector 110 may output the generated comparison pulse CPLS to the pulse-voltage converter 120. For example, the phase frequency detector 110 may generate the comparison pulse CPLS based on the reference frequency FREF and a first frequency, which corresponds to the output frequency FOUT divided by a number n (e.g., FOUT/n). Each of the reference frequency FREF, the output frequency FOUT and the frequency FOUT/n may be in the form of clock signals or clocks.

The comparison pulse CPLS may be, for example, a pulse having a width and sign corresponding to a difference between frequency FOUT/n and the reference frequency. The frequency FOUT/n may be generated by dividing the output frequency FOUT by a given number or value n. The PLL 100 may further include a reference frequency generator 140. The reference frequency generator 140 may be configured to generate the reference frequency FREF.

In at least one example embodiment, the reference frequency FREF may have a relatively stable and/or relatively low frequency. The output frequency FOUT may have a relatively high frequency, for example, as requested by a system (not shown). In this example, for the PFD 110 to compare the reference frequency FREF and the output frequency FOUT, the PLL 100 may further include a frequency divider 150. The frequency divider 150 may divide the output frequency FOUT by n (wherein n may be a natural number) and output the divided frequency FOUT/n to the PFD 110.

In at least this example, the output frequency FOUT may be generated by the VCO 130. The VCO 130 may generate the output frequency FOUT in response to and/or based on a control voltage VCTRL. Because operations of the VCO 130 of the PLL 100 are well-known in the art, a detailed description thereof will be omitted for the sake of brevity.

Figure 5:
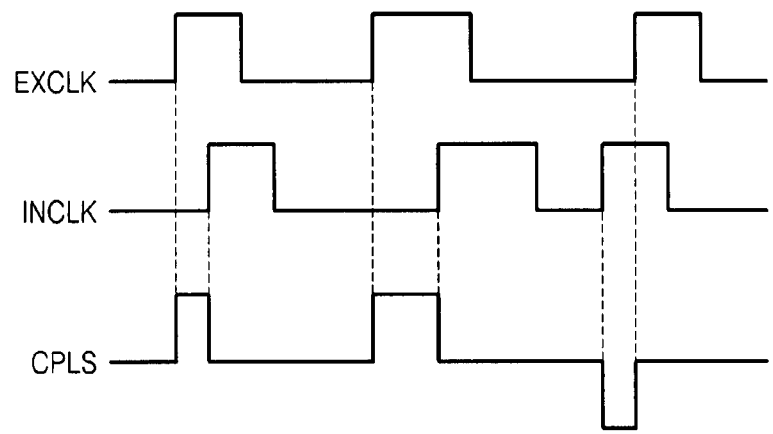
FIG. 5 is a timing diagram illustrating an example comparison pulse of FIG. 4.

FIG. 5 is a timing diagram illustrating an example comparison pulse CPLS of FIG. 4. Referring to FIG. 5, when an external clock EXCLK leads an internal clock INCLK, the comparison pulse CPLS may have a first (e.g., a positive) value. When the internal clock INCLK leads the external clock EXCLK, the comparison pulse CPLS may have a second (e.g., a negative) value. In this example, the reference frequency FREF of FIG. 4 may be the frequency of the external clock EXCLK, and the divided frequency FOUT/n may be the frequency of the internal clock INCLK.

Referring back to FIG. 4, the pulse-voltage converter 120 may be configured to generate the control voltage VCTRL based on the comparison pulse CPLS. For example, the pulse-voltage converter 120 may generate the control voltage VCTRL by charging or discharging charge using a charge pump current. The charge pump current may be the square of a control current corresponding to the control voltage VCTRL.

Figure 6:
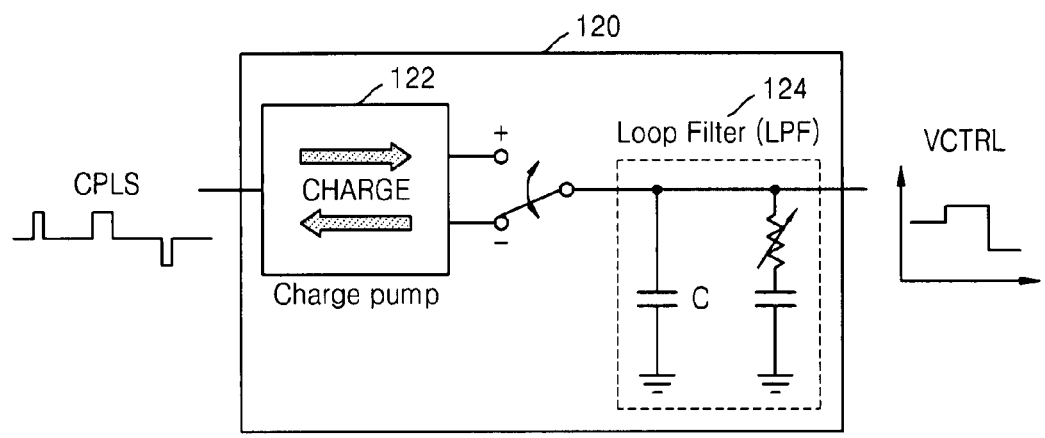
FIG. 6 is a diagram illustrating a pulse-voltage converter according to an example embodiment.

FIG. 6 is a diagram illustrating a pulse-voltage converter according to an example embodiment. The pulse-voltage converter of FIG. 6 may be included in the PLL of FIG. 4.

Referring to FIGS. 4 and 6, the pulse-voltage converter 120 may include a charge pump 122 and/or a loop filter 124. The charge pump 122 may be configured to generate the charge pump current. The loop filter 124 may change the control voltage VCTRL by charging or discharging the charge by the charge pump current.

The loop filter 124 may be a low pass filter in which a plurality of (e.g., two) capacitors C are connected in parallel. According to at least one example embodiment, the loop filter 124 of FIG. 6 may be a secondary loop filter. The charge pump current may sink or source based on the comparison pulse CPLS to/from the loop filter 124.

Figure 7A:
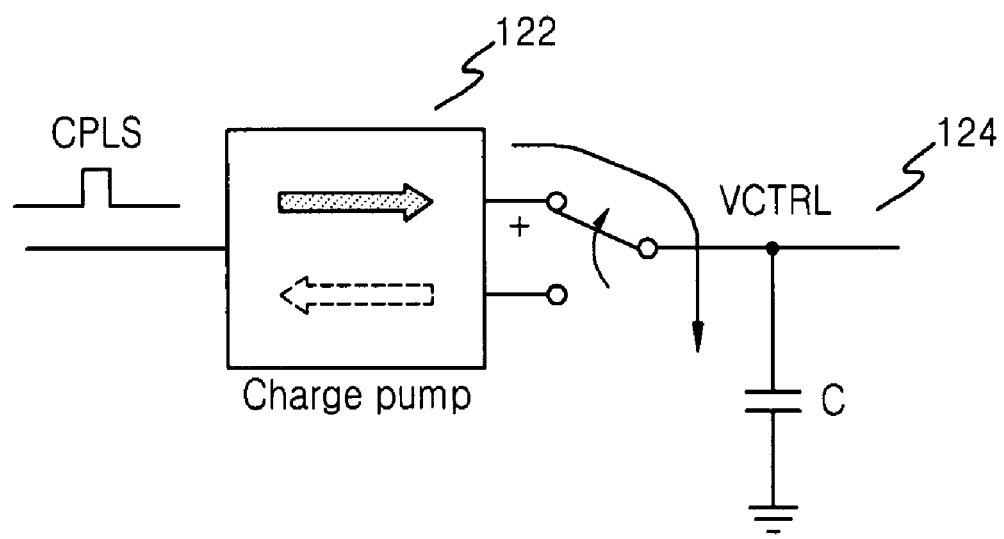
FIGS. 7A and 7B are diagrams briefly illustrating example operations of the pulse-voltage converter of FIG. 4.
Figure 7B:
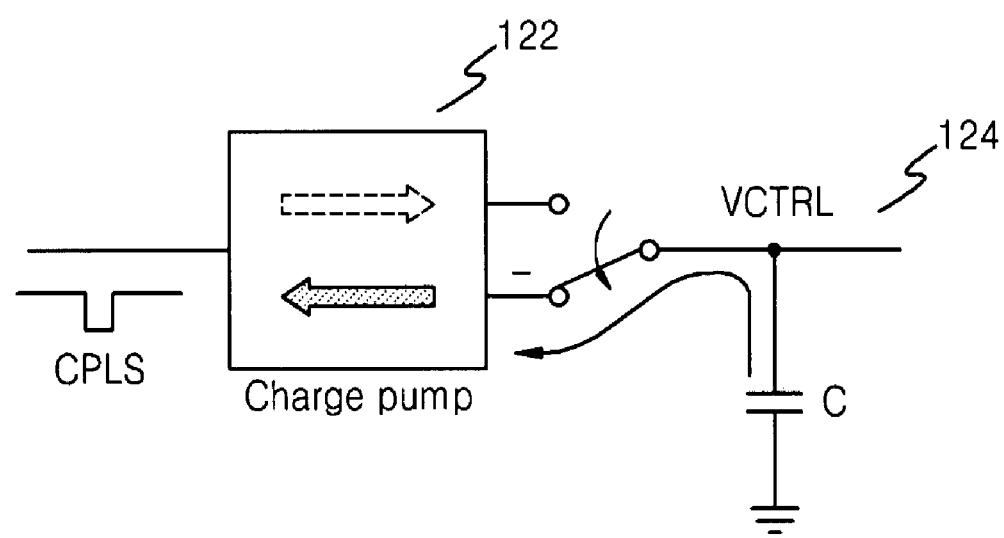

FIGS. 7A and 7B are diagrams illustrating example operations of the pulse-voltage converter of FIGS. 4 and/or 6.

Referring to FIG. 7A, when the comparison pulse CPLS has a positive value, the charge pump 122 may supply the charge pump current to the loop filter 124. In this case, the capacitor C may be charged and the control voltage VCTRL may increase. As described with regard to FIG. 5, the comparison pulse CPLS may have a positive value when the external clock EXCLK leads the internal clock INCLK.

Referring to FIG. 7B, when the comparison pulse CPLS has a negative value, the capacitor C may be discharged and the control voltage VCTRL may decrease.

Figure 8:
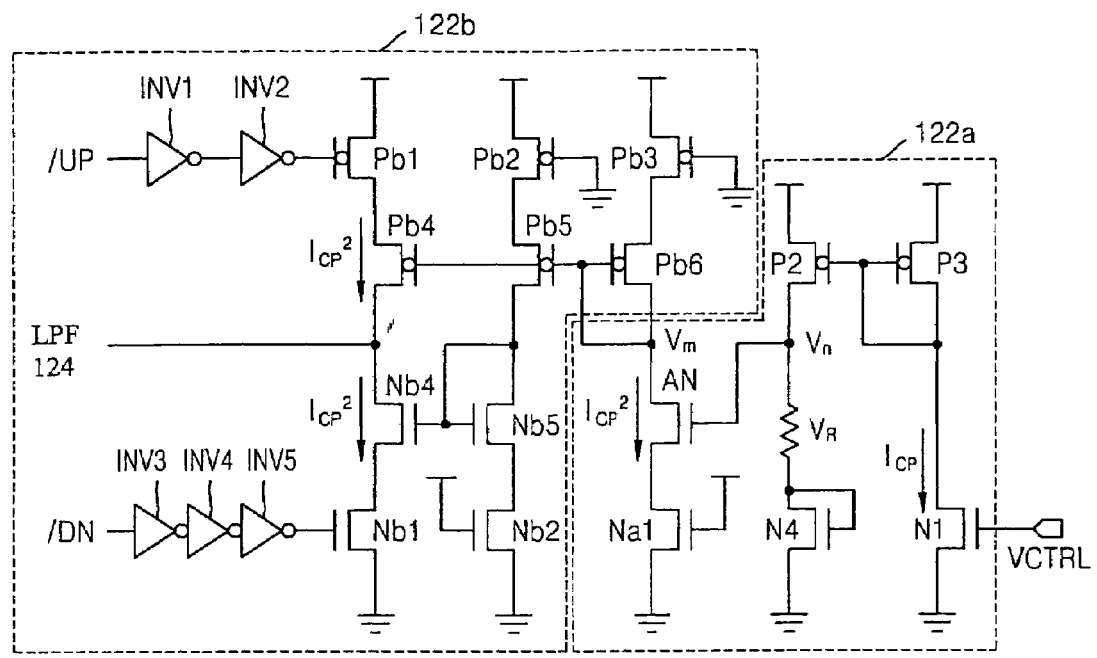
FIG. 8 is a circuit diagram illustrating a charge pump according to an example embodiment.

FIG. 8 is a circuit diagram illustrating a charge pump according to an example embodiment. The charge pump of FIG. 8 may be used as the charge pump 122 illustrated in FIGS. 6, 7A and 7B.

Referring to FIG. 8, the charge pump 122 may include a current boosting circuit 122a and a charge pump current source/sink circuit 122b. The current boosting circuit 122a may be configured to generate the control current $I_{cp}$ as a charge pump current $I_{cp}^2$. The charge pump current source/sink circuit 122b may source or sink the charge pump current $I_{cp}^2$ according to or based on the comparison pulse CPLS.

Figure 9:
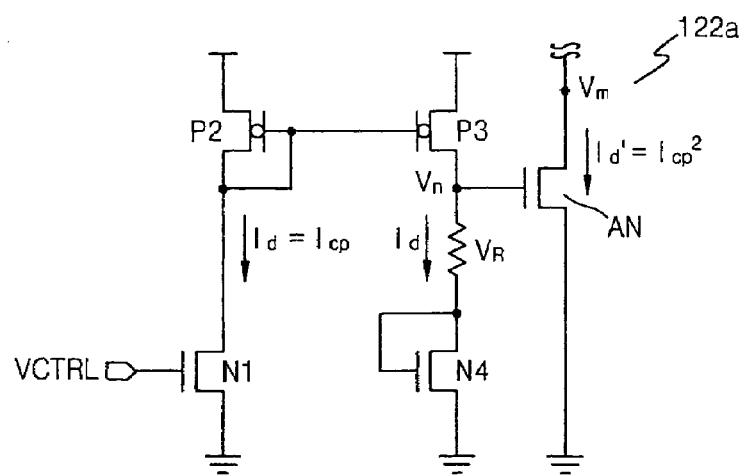
FIG. 9 is a circuit diagram for describing example operations of a current boosting circuit according to an example embodiment.

FIG. 9 is a circuit diagram illustrating example operation of the current boosting circuit illustrated in FIG. 8.

Referring to FIGS. 8 and 9, the current boosting circuit 122a may include a plurality of transistors configured such that the current boosting circuit 122a generates the control current $I_{cp}$ as a charge pump current $I_{cp}^2$. For example, the current boosting circuit may include first through fourth transistors N1, P2, P3, N4, a resistor R and/or an amplifying transistor AN. In at least this example embodiment, sizes and/or threshold voltages $V_{th}$ of the first through fourth transistors N1, P2, P3, N4 and/or the amplifying transistor AN may be the same or substantially the same. The first and fourth transistors N1 and N4 may be NMOS transistors, whereas the second and third transistors P2 and P3 may be PMOS transistors. However, these types of transistors may be used interchangeably in similar or substantially similar configurations.

In the first transistor N1, the control voltage VCTRL may be a gate voltage and one terminal may be connected to a ground voltage. The first transistor N1 may be turned on or activated by the control voltage VCTRL and may generate the control current $I_{cp}$ corresponding to the control voltage VCTRL. Currents $I_d$ and $I_d'$ in FIG. 9 correspond to currents $I_{cp}$ and $I_{cp}^2$, respectively, in FIG. 8.

Gates of the second and third transistors P2 and P3 may be connected to the first transistor N1. In addition, a terminal of the third transistor P3 may be connected to the resistor R. Accordingly, the control current $I_{cp}$ may flow through the resistor R.

A gate and one terminal of the fourth transistor N4 may be connected to the resistor R and another terminal of the fourth transistor N4 may be connected to the ground voltage. Accordingly, a node voltage $V_n$ of a node connected to the resistor R and the third transistor P3 may be given by Equation (6) shown below.

$$V_n = V_R + V_{th1} = R^* I_d + V_{th1} \quad (6)$$

In Equation 6, $V_{th1}$ is a threshold voltage of the fourth transistor N4 and $V_R$ is the voltage across the resistor R.

The amplifying transistor AN may generate the charge pump current $I_{cp}^2$. A gate of the amplifying transistor AN may be connected to the node and a source may be connected to the ground voltage. According to at least one example embodiment, the amplifying transistor AN may be a MOS (e.g., an NMOS) transistor. The saturation current $I_d'$ of the amplifying transistor AN may be proportional to the square of a gate-source voltage $V_{gs}$.

Because the node voltage $V_n$ in the amplifying transistor AN is a gate voltage and the ground voltage is a source voltage, the saturation current $I_d'$ of the amplifying transistor AN may be given by Equation (7) below.

$$I_d' = \beta^*(V_n - V_{th2})^2 \quad (7)$$

In Equation 7, $V_{th2}$ is a threshold voltage of the amplifying transistor AN. Substituting Equation 7 into Equation 6, the result is Equation (8).

$$I_d' = \beta^*(V_n - V_{th2})^2 = \beta^*((R^* I_d + V_{th1}) - V_{th2})^2 \quad (8)$$

If $V_{th1}$ and $V_{th2}$ are equal, the saturation current $I_d'$ of the amplifying transistor AN may be given by Equation (9).

$$I_d' = \beta^*(R^* I_d)^2 \quad (9)$$

Referring to Equation (9), the saturation current $I_d'$ of the amplifying transistor AN may be proportional to the square of the control current $I_{cp}$. Accordingly, as described above, the amplifying transistor AN may generate the charge pump current $I_{cp}^2$, which may be the square of the control current $I_{cp}$.

When the charge pump current $I_{cp}^2$ is substituted into Equation 3, for example, when Equation (10) is substituted into Equation 3, the loop bandwidth of the adaptive bandwidth PLL according to at least this example embodiment may be given by Equation (11) below.

$$I_{CP}^S = (I_{CP})^3 \quad (10)$$

$$\omega n \propto I_{cp}/M \quad (11)$$

In Equation (11), M is a constant. Referring to Equations (2) and (11), the input frequency $\omega_{REF}$ may also be proportional to the charge pump current $I_{cp}$, and thus, a ratio of the loop bandwidth to the input frequency $\omega_n/\omega_{REF}$ of the adaptive bandwidth PLL including the current boosting circuit, according to at least this example embodiment, may have a more uniform value independent of frequency.

Similarly, when the charge pump current $I_{cp}^2$ is substituted into Equation 4 (e.g., when Equation (10) shown below is substituted into Equation 4), the damping factor of the adaptive bandwidth PLL, according to at least this example embodiment, may be given by Equation (12) below.

$$\zeta \propto R^* I_{CP}^* K \quad (12)$$

In Equation (12), K is a given constant. Because R is the reciprocal of the conductance of the loop filter, R may be given by Equation (13) below.

$$R \propto 1/\beta(V - Vth) \propto 1/\sqrt{I_{CP}^S} \propto 1/I_{CP} \quad (13)$$

Thus, the damping factor of the adaptive bandwidth PLL, according to at least this example embodiment, may also have a more uniform value independent of frequency, as shown in Equation (14).

$$\zeta \propto (1/I_{CP})^* I_{CP}^* K = constant \quad (14)$$

Referring to FIGS. 7 and 8, the charge pump current source/sink circuit 122b may source the charge pump current $I_{cp}^2$ to the loop filter 124 when the comparison pulse CPLS has a positive value (e.g., when /UP is enabled), and may sink the charge pump current $I_{cp}^2$ from the loop filter 124 when the comparison pulse CPLS has a negative value (e.g., when /DN is enabled). When the comparison pulse CPLS has a positive value, /UP is Logic "Low" and /DN is Logic "High". Inverters INV1 and INV2 as well as a signal of Logic "Low" gate the PMOS transistor Pb1. In response to a signal Logic "Low", the PMOS transistor Pb1 turns on. When PMOS transistor Pb1 turns on, the charge pump current source/sink circuit 122b may source the charge pump current $I_{cp}^2$ to the loop filter 124. Transistors Pb4, Pb5 and Pb6 each having gates connecting to each other mirror the current, $I_{cp}^2$, flowing from the Node Vm to the amplifying transistor AN. When the comparison pulse CPLS has a negative value, /UP is Logic "High" and /DN is Logic "Low". Inverters INV3, INV4 and INV5 as well as a signal of Logic "High" gate the NMOS transistor Nb1, and the NMOS transistors Nb1 and Nb4 turns on. Therefore, the charge pump current source/sink circuit 122b may sink the charge pump current $I_{cp}^2$ from the loop filter 124. PMOS transistors Pb2, Pb3 and NMOS transistors Na1. Nb2 may operate as a load.

Accordingly, an adaptive bandwidth PLL, according to at least some example embodiments, may include a current boosting circuit configured to generate the charge pump current $I_{cp}^2$, which may be the square of the control current $I_{cp}$, in response to the comparison pulse CPLS, and thus may have a more uniform performance independent of frequency.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A phase locked loop comprising:
   a phase frequency detector configured to generate a comparison pulse having a pulse-width and sign corresponding to a difference between a first frequency and a reference frequency, the first frequency being generated by dividing an output frequency by a number;
   a pulse-voltage converter configured to generate a control voltage corresponding to the comparison pulse, the control voltage being generated by a charge pump configured to generate a charge pump current, the charge pump current being proportional to a control current corresponding to the control voltage, the charge pump including,
      a current mirror configured to generate the control current based on the control voltage,
      a resistor across which a first voltage drop occurs, the first voltage drop corresponding to the control current, and
      an amplifying transistor configured to generate the charge pump current based on the first voltage drop; and
   an oscillator configured to generate the output frequency based on the control voltage.

2. The phase locked loop of claim 1, wherein the pulse-voltage converter includes,
   a loop filter configured to change the control voltage by charging or discharging the charge based on the charge pump current.

3. The phase locked loop of claim 2, wherein the charge pump includes,
   a charge pump current circuit configured to source or sink the charge pump current based on the comparison pulse.

4. The phase locked loop of claim 1, wherein the current mirror includes a plurality of transistors, the plurality of transistors being configured such that the current mirror generates the control current based on the control voltage.

5. The phase locked loop of claim 4, wherein the plurality of transistors include,
   a first transistor having the control voltage as a gate voltage and one terminal connected to a ground voltage,
   a second transistor having a gate and one terminal connected to the first transistor,
   a third transistor having a gate connected to the second transistor and one terminal is connected to the resistor, and
   a fourth transistor having a gate and one terminal connected to the resistor and another terminal connected to the ground voltage.

6. The phase locked loop of claim 4, wherein the plurality of transistors include NMOS transistors and PMOS transistors.

7. The phase locked loop of claim 1, wherein the amplifying transistor is an NMOS transistor.

8. The phase locked loop of claim 3, wherein the charge pump current circuit sources the charge pump current when the comparison pulse has a first value and sinks the charge pump current when the comparison pulse has a second value, the first and second values being different.

9. The phase locked loop of claim 2, wherein the loop filter is a low pass filter.

10. The phase locked loop of claim 1, further including,
    a reference frequency generator configured to generate the reference frequency.

11. The phase locked loop of claim 1, further including,
    a frequency divider configured to divide the output frequency by the number, the number being a natural number.

12. The phase locked loop of claim 1, wherein the phase locked loop is an adaptive bandwidth phase locked loop.

13. A phase locked loop comprising:
    a phase frequency detector configured to generate a comparison pulse having a pulse-width and sign corresponding to a difference between a first frequency and a reference frequency, the first frequency being generated by dividing an output frequency by a number;
    a pulse-voltage converter configured to generate a control voltage corresponding to the comparison pulse, the control voltage being generated by charging or discharging charge using a charge pump current, the charge pump current being the square of a control current which corresponds to the control voltage; and
    an oscillator configured to generate the output frequency based on the control voltage.

14. The phase locked loop of claim 13, wherein the pulse-voltage converter includes,
    a charge pump including,
       a current boosting circuit configured to generate the charge pump current, and
       a charge pump circuit configured to source or sink the charge pump current based on the comparison pulse.

15. The phase locked loop of claim 14, wherein the current boosting circuit includes,
    a current mirror configured to generate the control current in response to the control voltage,
    a resistor across which a first voltage drop occurs, and
    an amplifying transistor configured to generate the charge pump current based on the first voltage drop.

16. The phase locked loop of claim 14, wherein the charge pump circuit sources the charge pump current when the comparison pulse has a first value and sinks the charge pump current when the comparison pulse has a second value, the first and second values being different.

17. The phase locked loop of claim 15, wherein the current mirror includes a plurality of transistors, the plurality of transistors being configured such that the current mirror generates the control current based on the control voltage.

18. The phase locked loop of claim 17, wherein the plurality of transistors include NMOS transistors and PMOS transistors.

19. The phase locked loop of claim 16, wherein the current boosting circuit comprises:
    a current mirror configured to generate the control current corresponding to the control voltage;
    a resistor across which the control voltage drop occurs; and an amplifying transistor configured to generate a second current based on the first voltage drop across the resistor.

20. The phase locked loop of claim 19, wherein the current mirror includes a plurality of transistors, the plurality of transistors being configured such that the current mirror generates the control current based on the control voltage.

21. The phase locked loop of claim 17, wherein the plurality of transistors include, a first transistor having the control voltage as a gate voltage and one terminal connected to a ground voltage, a second transistor having a gate and one terminal connected to the first transistor, a third transistor having a gate connected to the second transistor and one terminal is connected to the resistor, and a fourth transistor having a gate and one terminal connected to the resistor and another terminal connected to the ground voltage.

22. The phase locked loop of claim 20, wherein the plurality of transistors include NMOS transistors and PMOS transistors.

23. The phase locked loop of claim 15, wherein the amplifying transistor is an NMOS transistor.

\* \* \* \* \*